United States Patent
Marciano et al.

(10) Patent No.: US 10,203,200 B2
(45) Date of Patent: Feb. 12, 2019

(54) ANALYZING ROOT CAUSES OF PROCESS VARIATION IN SCATTEROMETRY METROLOGY

(71) Applicant: KLA-Tencor Corporation, Milpitas, CA (US)

(72) Inventors: Tal Marciano, Zychron Yaacov (IL); Michael E. Adel, Zichron Ya'akov (IL); Mark Ghinovker, Yoqneam Ilit (IL); Barak Bringoltz, Rishon le Tzion (IL); Dana Klein, Haifa (IL); Tal Itzkovich, Kfar Uriya (IL); Vidya Ramanathan, Clifton Park, NY (US); Janay Camp, Ballston Spa, NY (US)

(73) Assignee: KLA-Tencor Corporation, Milpitas, CA (US)

(*) Notice: Subject to any disclaimer, the term of this patent is extended or adjusted under 35 U.S.C. 154(b) by 23 days.

(21) Appl. No.: 15/329,618

(22) PCT Filed: Nov. 1, 2016

(86) PCT No.: PCT/US2016/059954
§ 371 (c)(1),
(2) Date: Jan. 27, 2017

(87) PCT Pub. No.: WO2017/146786
PCT Pub. Date: Aug. 31, 2017

(65) Prior Publication Data
US 2018/0023950 A1    Jan. 25, 2018

Related U.S. Application Data

(60) Provisional application No. 62/299,693, filed on Feb. 25, 2016.

(51) Int. Cl.
*G06F 11/00* (2006.01)
*G01B 11/27* (2006.01)
(Continued)

(52) U.S. Cl.
CPC ........ *G01B 11/272* (2013.01); *G03F 7/70616* (2013.01); *G03F 7/70633* (2013.01); *H01L 22/12* (2013.01); *H01L 22/20* (2013.01)

(58) Field of Classification Search
CPC ........ H01L 2924/0002; H01L 2924/00; G01N 21/4788; G01N 21/9501
(Continued)

(56) References Cited

U.S. PATENT DOCUMENTS 9,903,711 B2 * 2/2018 Levy .................... G01B 11/272
2003/0168594 A1 * 9/2003 Muckenhirn ...... G01N 21/4788
250/307

(Continued)

FOREIGN PATENT DOCUMENTS

WO    2015049087    4/2015
WO    2016086056    6/2016

OTHER PUBLICATIONS

ISA/KR, International Search Report for PCT/US2016/059954 dated Jan. 11, 2017.

*Primary Examiner* — Edward Raymond
(74) *Attorney, Agent, or Firm* — Hodgson Russ LLP

(57) ABSTRACT

Method, metrology modules and RCA tool are provided, which use the behavior of resonance region(s) in measurement landscapes to evaluate and characterize process variation with respect to symmetric and asymmetric factors, and provide root cause analysis of the process variation with respect to process steps. Simulations of modeled stacks with different layer thicknesses and process variation factors may be used to enhance the analysis and provide improved target designs, improved algorithms and correctables for metrology measurements. Specific targets that exhibit sensitive resonance regions may be utilize to enhance the evaluation of process variation.

23 Claims, 10 Drawing Sheets

(51) Int. Cl.
*G03F 7/20* (2006.01)
*H01L 21/66* (2006.01)

(58) Field of Classification Search
USPC .......................................... 702/150, 182–185
See application file for complete search history.

(56) References Cited

U.S. PATENT DOCUMENTS

| | | | |
|---|---|---|---|
| 2004/0203177 A1* | 10/2004 | Davis | G03F 7/70625 438/14 |
| 2005/0023434 A1* | 2/2005 | Yacoubian | G01N 29/2418 250/200 |
| 2006/0215175 A1* | 9/2006 | Yacoubian | G01N 21/1717 356/502 |
| 2011/0043791 A1 | 2/2011 | Smilde et al. | |
| 2011/0154272 A1 | 6/2011 | Hsu et al. | |
| 2012/0022836 A1 | 1/2012 | Ferns et al. | |
| 2013/0054186 A1 | 2/2013 | Den Boef | |
| 2013/0262044 A1 | 10/2013 | Pandev et al. | |
| 2014/0257734 A1 | 9/2014 | Bringoltz et al. | |
| 2015/0204664 A1 | 7/2015 | Bringoltz et al. | |
| 2015/0233705 A1 | 8/2015 | Bringoltz et al. | |
| 2015/0316490 A1 | 11/2015 | Amit et al. | |

* cited by examiner

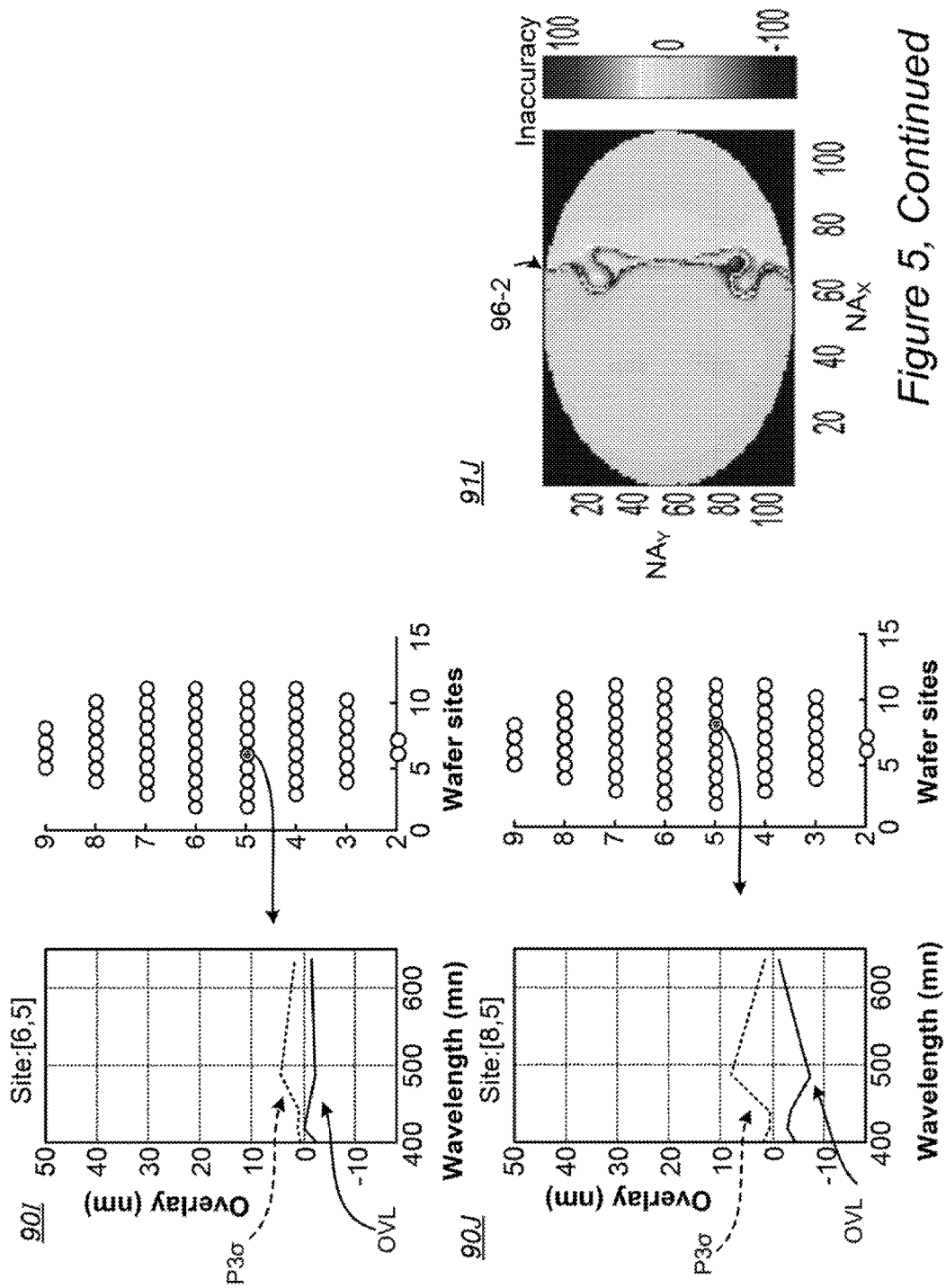
Figure 5, Continued

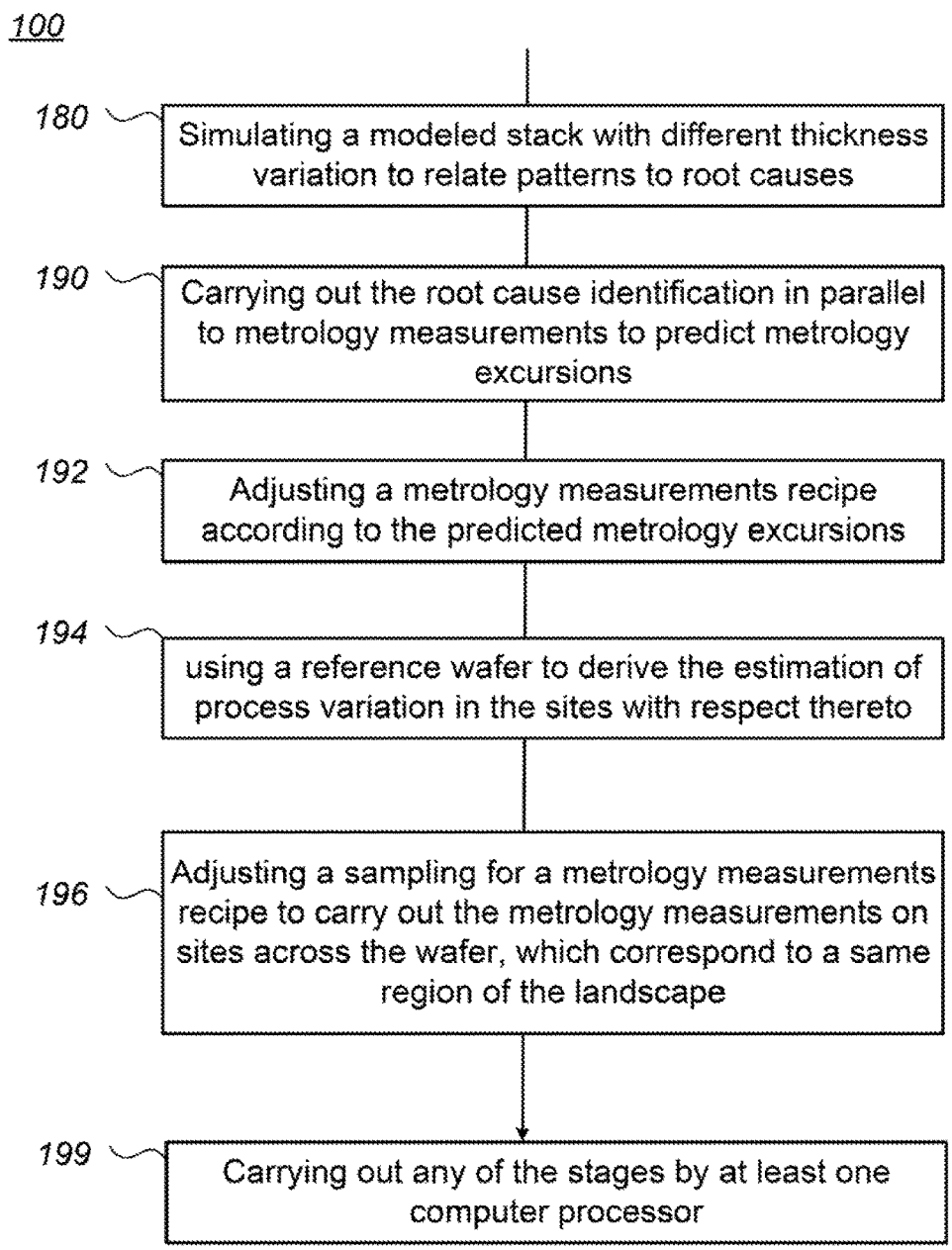
Figure 6, Continued

ANALYZING ROOT CAUSES OF PROCESS VARIATION IN SCATTEROMETRY METROLOGY

CROSS REFERENCE TO RELATED APPLICATIONS

This application claims the benefit of U.S. Provisional Patent Application No. 62/299,693 filed on Feb. 25, 2016, which is incorporated herein by reference in its entirety.

BACKGROUND OF THE INVENTION

1. Technical Field

The present invention relates to the field of metrology, and more particularly, to scatterometry-based metrology.

2. Discussion of Related Art

WIPO Publication No. 2016086056, which is incorporated herein by reference in its entirety, discloses methods of deriving a partially continuous dependency of metrology metric(s) on recipe parameter(s), analyzing the derived dependency, determining a metrology recipe according to the analysis, and conducting metrology measurement(s) according to the determined recipe. The dependency may be analyzed in form of a landscape such as a sensitivity landscape in which regions of low sensitivity and/or points or contours of low or zero inaccuracy are detected, analytically, numerically or experimentally, and used to configure parameters of measurement, hardware and targets to achieve high measurement accuracy. Process variation is analyzed in terms of its effects on the sensitivity landscape, and these effects are used to characterize the process variation further, to optimize the measurements and make the metrology both more robust to inaccuracy sources and more flexible with respect to different targets on the wafer and available measurement conditions.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising: (i) deriving a landscape from simulation and/or from a plurality of scatterometry measurements, wherein the landscape comprises an at least partially continuous dependency of at least one metrology metric on at least one parameter, (ii) identifying, in the derived landscape, at least one resonance region that corresponds to a resonance of optical illumination in a measured location, (iii) analyzing a dependency of the identified at least one resonance region on specified changes in the at least one parameter, and (iv) deriving from the analysis an estimation of process variation.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
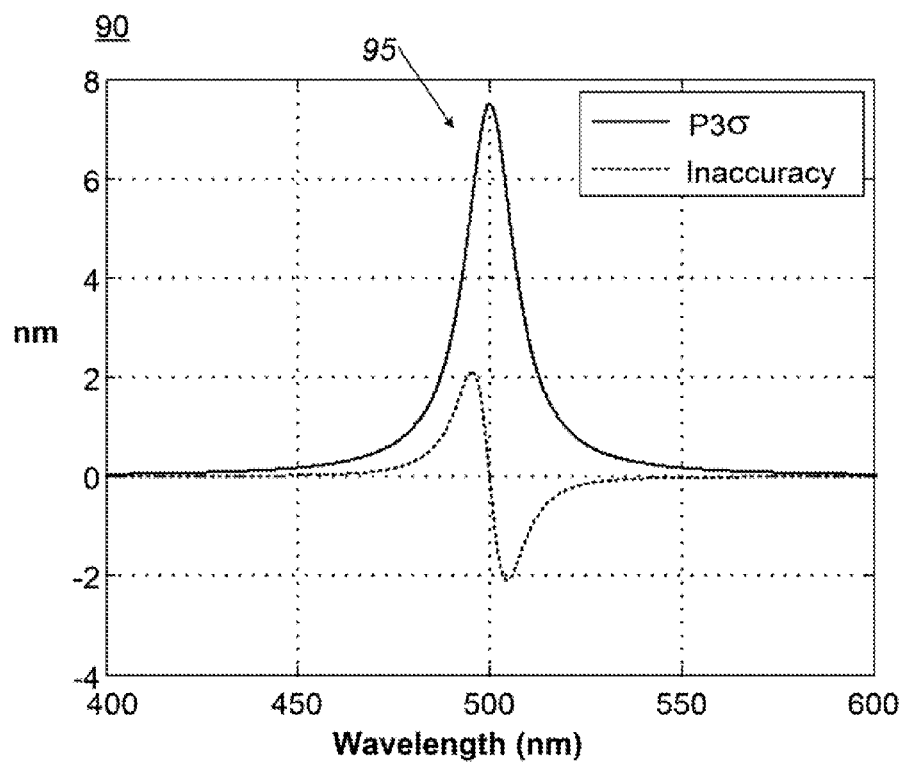
FIG. 1 is a schematic example for a resonance region with respect to wavelength and pupil coordinates in a landscape diagram and in a pupil image, respectively, according to some embodiments of the invention.
Figure 1:
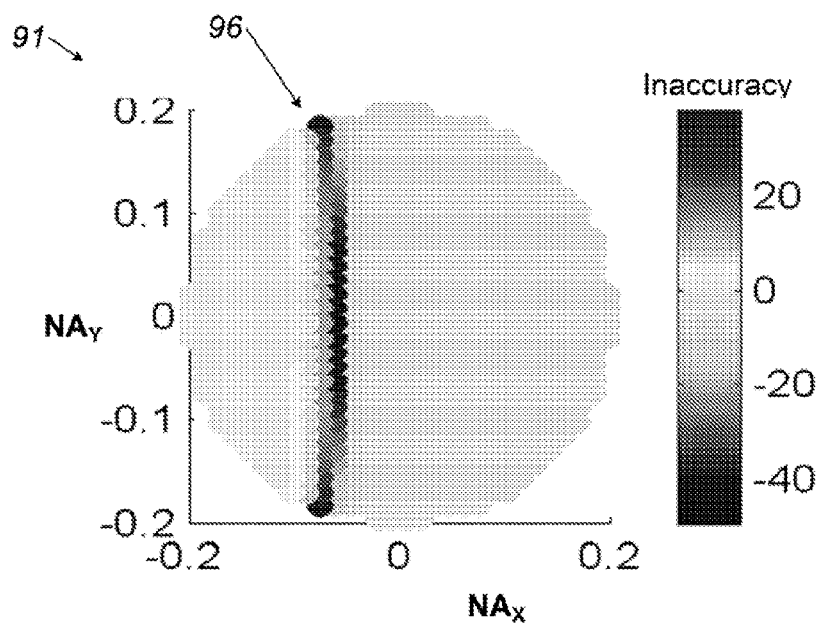

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for identifying and evaluating different sources of process variation and their repartition over a wafer with the help of overlay metrology tool. The disclosed invention may be extended and implemented to any metrology tool. For example, measuring the diffraction signals over the pupil permits to extract more information beyond the breaking of symmetry due to the overlay. The process variation may be measured on identified resonant regions (see below) and be estimated qualitatively and quantitatively, possibly with additional help of simulations. The pupil analysis disclosed in following, which combines the landscape theory with simulation steps and tools, enables to detect, track and quantify different types of process variation which may be used to anticipate the breaking of measurement recipes and to guide target design processes.

Method, metrology modules and RCA tool are provided, which use the behavior of resonance region(s) in measurement landscapes to evaluate and characterize process variation with respect to symmetric and asymmetric factors, and provide root cause analysis of the process variation with respect to process steps. Simulations of modeled stacks with different layer thicknesses and process variation factors may be used to enhance the analysis and provide improved target designs, improved algorithms and correctables for metrology measurements. Specific targets that exhibit sensitive resonance regions may be utilize to enhance the evaluation of process variation.

Landscapes and Resonance Regions

WIPO Publication No. 2016086056 discloses the concept of the landscape in metrology measurements, which is a dependency of one or more metrology metric(s), e.g., scatterometry overlay (SCOL) metrics, on one or more parameter. As a non-limiting example, the landscape may express the dependency of any of the overlay, the variation of the overlay (e.g., the Pupil3S metric) and/or the inaccuracy (estimated overlay minus real overlay) upon one or more process parameters, measurement parameters and target parameters. In particular, as described in WIPO Publication No. 2016086056, the inventors have found out that certain regions in the landscape exhibit steep changes that are related to resonances in the optical system (e.g., resonance of illumination within the wafer layers and/or between target structures), which may be used to provide more information on the measured region.

In particular, it has been shown that the SCOL technology is strongly wavelength dependent—over the wavelength spectrum, the different overlay metrology metrics (Signal, Sensitivity, Pupil3S, Overlay, etc.) systematically contain resonant regions in their landscapes that are extremely sensitive to different kinds of process variations, both to symmetric process variations over a wafer, as well as to asymmetric process variations. The on-going study of these resonant regions shows that the increased inaccuracy in these regions follows a very specific scheme that relates the different metrology optics to the involved process variation, as described below.

FIG. 1 is a schematic example for a resonance region 95, 96 with respect to wavelength and pupil coordinates in landscape diagram 90 and in pupil image 91, respectively, according to some embodiments of the invention. The illustrated inaccuracy is the difference between the estimated overlay and the real overlay (a difference caused by optical resonance in the target) and P3σ (also denoted P3S) is the three sigma measure of variation of the overlay over the pupil, in dependence on wavelength. FIG. 1 describes a non-limiting example for a very simple landscape (LS), in order to provide clear explanation of the principles in the present invention. In the example, the resonance occurs at 500 nm and the pupil overlay is illustrated with illumination at 500 nm. In the pupil image, resonance region 96 is present as an arc of discontinuity near the middle of the pupil (note the change of sign of the inaccuracy upon crossing arc 96, which corresponds to the change of sign of the inaccuracy in resonance region 95 when crossing 500 nm). It can be seen that in the resonant region the inaccuracy (real overlay-measured overlay) behaves nearly as the derivative of the Pupil3S.

Beyond measuring overlay, the SCOL technology may therefore being used for identifying, measuring and discriminating different sources of process variations (symmetric and asymmetric) that may occur over a wafer, creating a wafer map of the different types of process variations and evaluating the process robustness of different targets/recipes. Combined with a RCA tool, the strengths of the process variation could also be quantitatively monitored. The advantage of measuring the pupil signals of SCOL targets is that these characteristics may be obtained directly from the signal over the pupil images of a single recipe.

Indeed, the pupil carries high amount of information about the process. In SCOL Overlay technology, the reflectivity of the signal is measured over the pupil, with each pixel corresponding to a different angle of incidence or wave-vector. The per-pixel differential signal is then calculated from the +1 and −1 diffracted orders of the two different cells with two different induced $f_0$ offset (e.g., equal and opposite+$f_0$ and −$f_0$). This permits to measure the breaking of symmetry of the signal and therefore the overlay. The measured reflectivity, however obeys different physical laws that result from optically illuminating a SCOL target that consists of a grating over grating structure. Such a structure could be regarded as a Fabry-Perot like resonator, and both the gratings and the resonator lead to different physical effects such as vanishing reflectivity at specific wavelengths/angle of incidence.

As the pupil contains a certain amount of pixels, with each pixel corresponding to a different angle of illumination, the resonant effects could directly being observed on the very pupil through arcs of discontinuities 96, or through specific gradients or noise patterns over the pupil overlay, or through vanishing pupil sensitivity. An increased asymmetric process variation would correspondingly increase those resonant effects that would be quantitatively measurable through the Pupil3 S for example.

Figure 6:
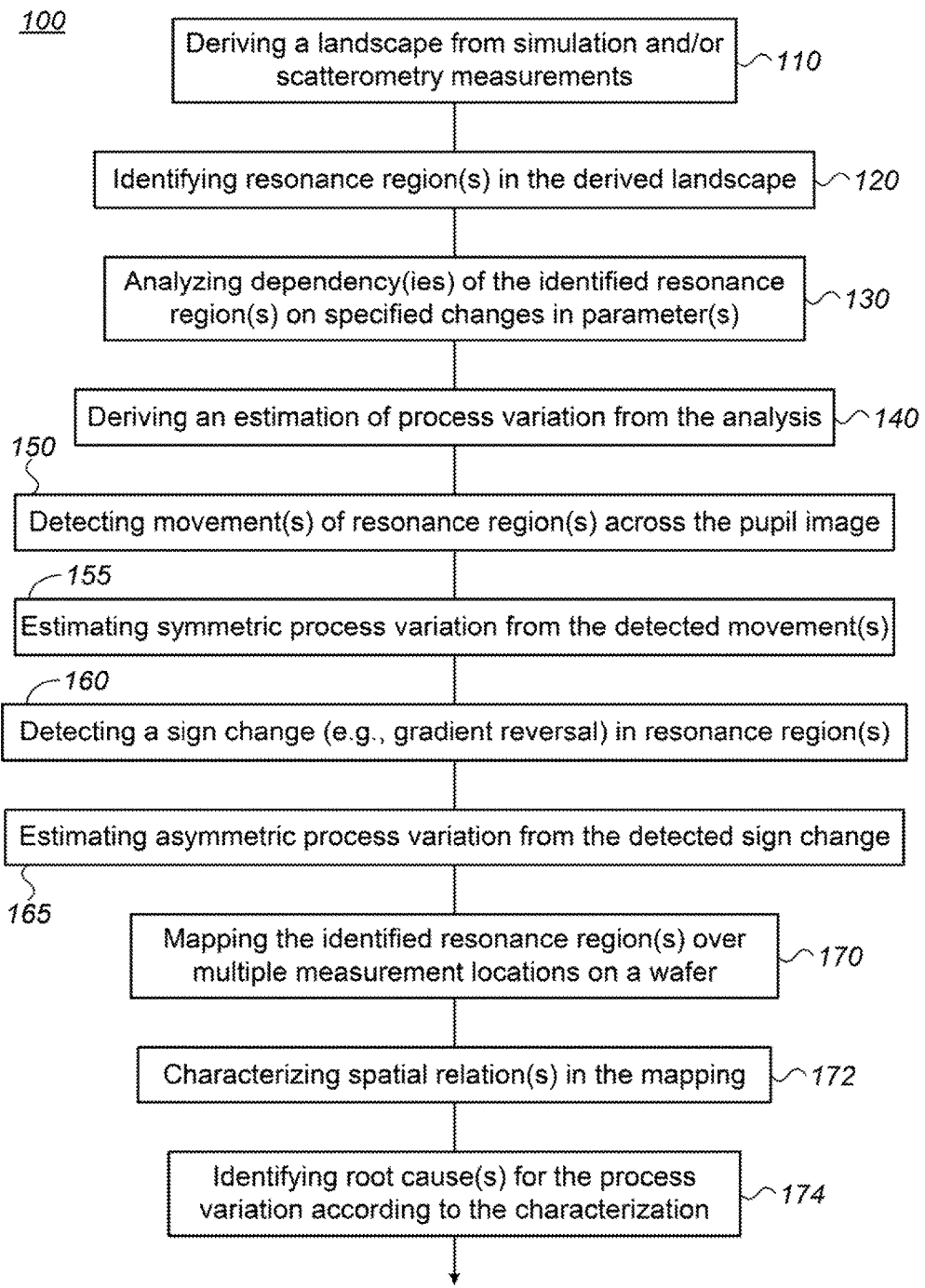
FIG. 6 is a high level flowchart illustrating a method relating to various aspects of the following disclosure, according to some embodiments of the invention.

FIG. 6 is a high level flowchart illustrating a method 100 relating to various aspects of the following disclosure, according to some embodiments of the invention. Certain embodiments comprise method 100 comprising deriving a landscape from simulation and/or from a plurality of scatterometry measurements (stage 110), wherein the landscape comprises an at least partially continuous dependency of at least one metrology metric on at least one parameter; identifying, in the derived landscape, at least one resonance region that corresponds to a resonance of optical illumination in a measured location (stage 120); analyzing a dependency of the identified at least one resonance region on specified changes in the at least one parameter (stage 130); and deriving from the analysis an estimation of process variation (stage 140). Any of the stages of method 100 may be carried out by at least one computer processor, e.g., computer processor(s) 201 (FIG. 7) (stage 199).

For example, the at least one metrology metric may comprise any of an overlay, an overlay variation metric and an inaccuracy metric defined with respect to the overlay, and the overlay may be calculated as in Equation 1, with $\vec{p}$ representing a pupil pixel, $f_0$ denoting a designed offset, and with $D_1$ and $D_2$ denoting, corresponding to opposite designed offsets, differences between signal intensities of opposing orders measured at pupil pixels which are rotated by 180° with respect to each other.

$$OVL(\vec{p}) = ((D_1(\vec{p}) + D_2(\vec{p}))/(D_1(\vec{p}) - D_2(\vec{p}))) \cdot f_0 \quad \text{Equation 1}$$

It is noted that symmetric variation influences primarily the term $D_1 + D_2$ while asymmetric variation influences primarily the term $D_1 - D_2$, resulting in different effects of symmetric and asymmetric process variation, as discussed below.

The at least one parameter may comprise any of an illumination wavelength, a pupil location, any other measurement parameter, any process parameter.

In the following, detailed method stages and analysis procedures are presented with respect to symmetric process variation, asymmetric process variation and more generally to root cause analysis of process variation and its relation to target and process design.

Symmetric Process Variation

In certain embodiments, method 100 may further comprise detecting a movement of the at least one resonance region across a simulated and/or measured pupil image as the at least one parameter (stage 150), and estimating symmetric process variation therefrom (stage 155).

Figure 2:
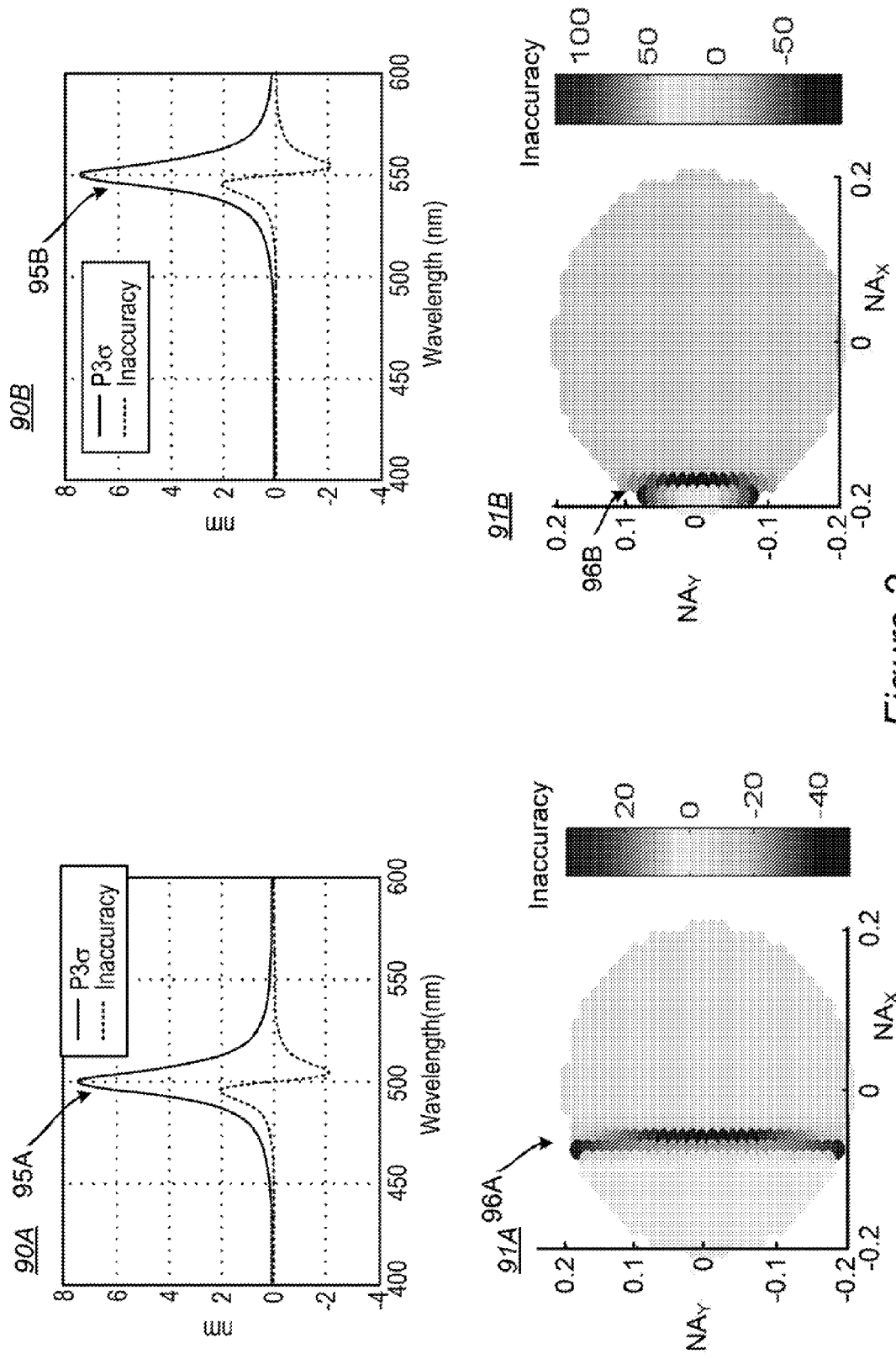
FIG. 2 is a schematic example for a movement of the resonance region with respect to wavelength and pupil coordinates in landscape diagrams and pupil images, respectively, due to symmetric process variations, according to some embodiments of the invention.

FIG. 2 is a schematic example for a movement of resonance region 95, 96 with respect to wavelength and pupil coordinates in landscape diagrams 90 and pupil images 91, respectively, due to symmetric process variations, according to some embodiments of the invention. Resonance regions are denoted 95A, 96A in landscape diagrams 90A and pupil image 91A, respectively, before the movement; and resonance regions are denoted 95B, 96B in landscape diagram 90B and pupil image 91B, respectively, after the movement.

FIG. 2 schematically illustrates the way a symmetric process variation affects the LS and the pupil. Considering that from one site on the wafer to another, the occurrence of some symmetric process variation such as thickness variation of one of the layers, variation of CD (critical dimension), etc., shifts resonance region 95A→95B in the landscape (90A→90B) as well as arc 96A→96B in the pupil image, which measured with the same recipe (91A→91B) (a measurement recipe comprises a combination of measurement parameters, conditions and algorithms). The accuracy as well as the Pupil3S and the sensitivity of the recipe also change since it moves to be lying on a different part of the landscape. Such movements indicate a low process robustness of the recipe to symmetric process variations and is unwanted in the prior art, however, the inventors have found that such recipes may be used for (i) estimating process robustness to symmetric process variations, (ii) creating wafer maps of the position of arc 96 over the wafer, which would be directly related to the symmetric process variations, and (iii) using RCA tools on which different symmetric process variation are applied. The position of arc 96 for each process variation may be compared to the position of arc 96 over the wafer and then the symmetric process variation may be quantitatively estimated over the wafer.

Accordingly, method 100 may further comprise mapping the identified at least one resonance region over a plurality of measurement locations on a wafer (stage 170), characterizing at least one spatial relation in the mapping (stage 172), and identifying a root cause for the process variation according to the characterization (stage 174). For example, the characterized spatial relation(s) may relate to symmetric process variation and the identified root cause may relate to specific process stage(s) that are known to result in the characterized symmetric process variation.

Figure 3A:
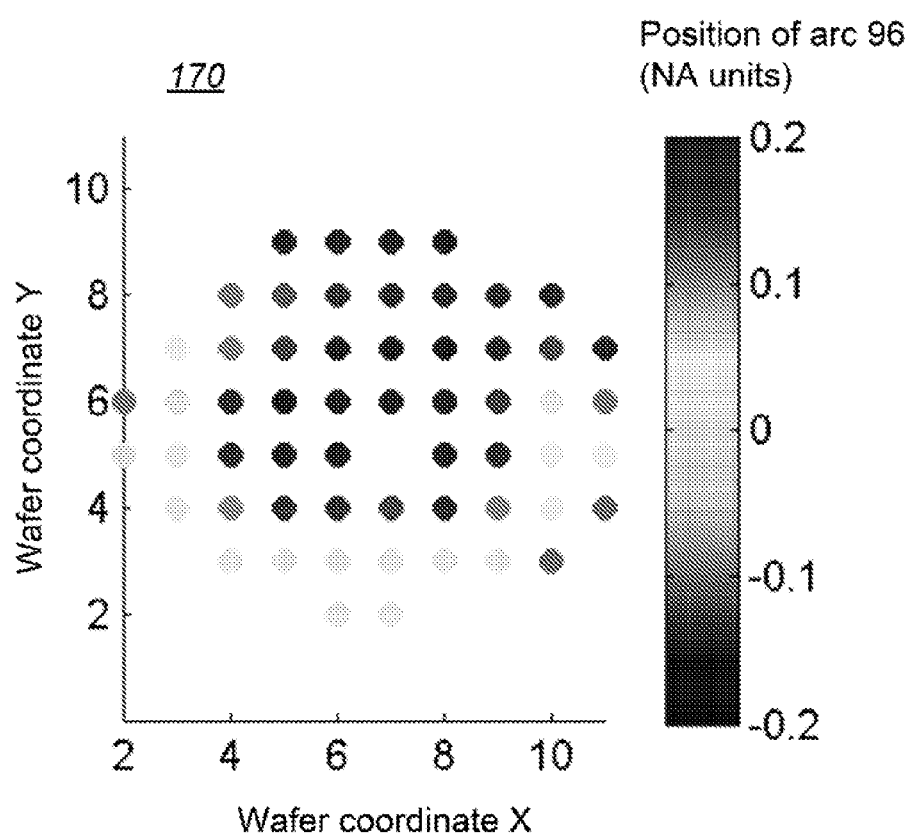
FIG. 3A is a schematic example for mapping of the location of the are in the pupil, over the wafer, according to some embodiments of the invention.

FIG. 3A is a schematic example for mapping 170 of the location of arc 96 in the pupil, over the wafer, according to some embodiments of the invention. In the illustrated example, tens of SCOL targets are measured over a wafer with all available wavelengths in order to create a discrete landscape, and the location of arc 96 (between 0 NA and 0.2 NA in the illustrated case) is presented by the color of the respective location. In the center of the wafer, arc 96 disappears. The wafer map signatures clearly indicate the symmetric variation of the arc position over the wafer, which indicates the presence of symmetric process variations.

Figure 3B:
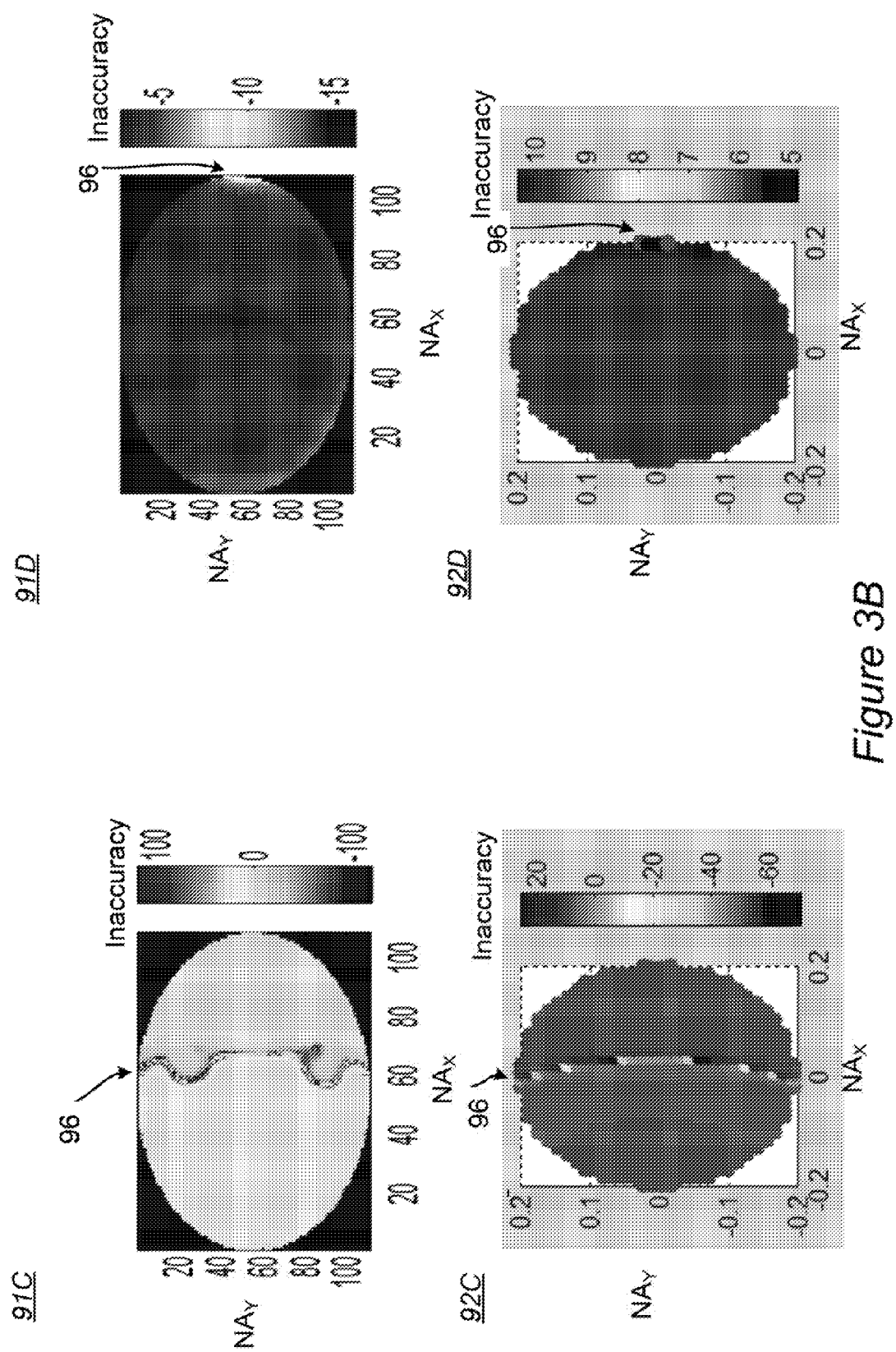
FIG. 3B is a schematic example for locations of the arc in the pupil in different sites of the wafer, when different sites are measured with the same recipe, from data and simulation, for different layer thicknesses, according to some embodiments of the invention.

FIG. 3B is a schematic example for locations of arc 96 in the pupil in different sites of the wafer, when different sites are measured with the same recipe, from data and simulation, for different layer thicknesses, according to some embodiments of the invention. Sites in the center and at the periphery of the wafer are compared, with arc 96 indicated on all four images. Pupil images 91C, 91D illustrate measured overlays over the pupils in different sites (center and edge, respectively) and pupil images 92C, 92D are simulated pupil images of the stack in the respective sites, wherein symmetric process variations were inserted in the simulation by varying the thickness of one of the layers. The site for which pupil images 91C, 92C are provided, has a minus 11 nm variation of the layer thickness from nominal thickness while the site for which pupil images 91D, 92D are provided, has a plus 1 nm variation of the layer thickness from nominal thickness. It is thus demonstrated that the resonant recipe may be used for monitoring layer thickness variations over the wafer that may affect the process robustness and eventually the accuracy of the measurements.

Moreover, certain embodiments comprise RCA tools 200 (see FIG. 7 below) which are configured to simulate the modeled stack with various homogenous thickness variations in order to simulate the involved thickness probable variations, and relate the patterns of process variation to specific root causes. Correspondingly, method 100 may comprise simulating a modeled stack with different thickness variation to relate patterns to root causes (stage 180). For example, different CVD (chemical vapor deposition) machines deposit different layers with different typical thickness variations over wafer, e.g., CVD of oxide layers may exhibit typical sombrero profiles while CVD of hard mask may exhibit dome-like thickness profiles over the wafer.

In the example shown in FIG. 3A, the radial symmetry of the arc location over the wafer may indicate a process variation that could correspond to a dome profile as the characterized spatial relation in the mapping (see stage 172) which may lead to identifying the corresponding CVD step as responsible for the process variation.

In the example shown in FIG. 3B, the corresponding layer was simulated with different range of thickness corresponding to the typical variations observed in such CVD. The arc position was tracked in simulation for the corresponding measured wavelength in the wafer and for different thickness variations of the designed layer. The simulation shows that the corresponding arc position between data (91C, 91D) and simulation (92C, 92D) at the edge of the wafer, corresponds to a thickness of the layer of −11 nm from the nominal stack (91C, 92C), while at the center of the wafer, this variation is about +1 nm (91D, 92D). Therefore, the root cause analysis of the process variation shows that the specific layer exhibits a variation of its thickness of ca. 12 nm from the center to the edges with a dome profile. The root cause analysis of the thickness variation can be clearly identified and quantified with the proposed method.

These examples show that the disclosed invention can permit to quantify, using an accurate model, the acceptable range of process variation that may affect the accuracy of the measurements and that simulation may be used in order to evaluate how such thickness variation may affect the accurate recipe for measuring overlay and perform model based accuracy estimation. Moreover, these examples provide ways to identify process variation leading to metrology excursions. For example, when accuracy metrics are in excursions, an RCA (root cause analysis) recipe (see more details below) may be used to identify the root cause of the process variation of the identified excursions, not necessarily requiring performing simulations.

Figure 7:
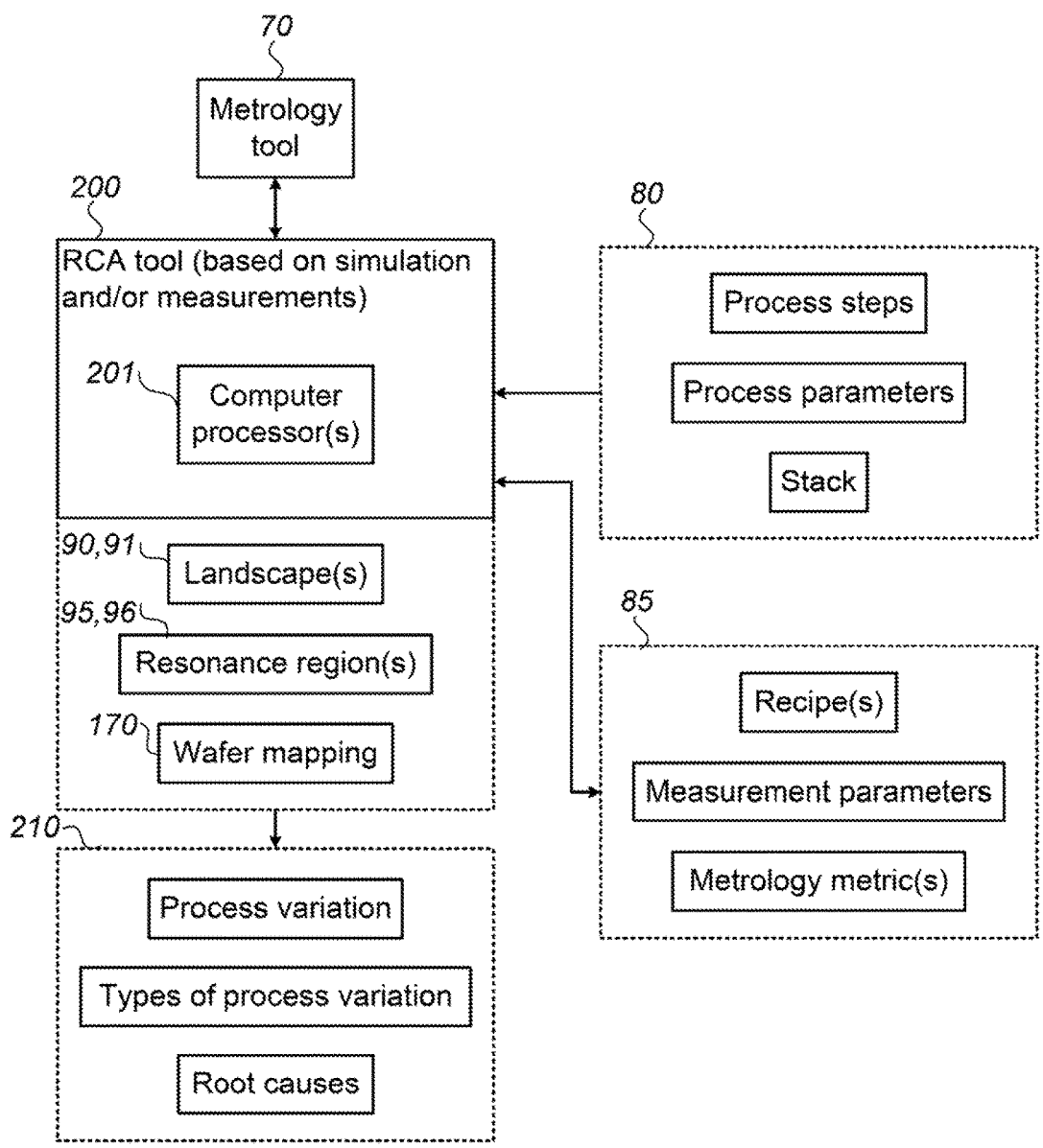
FIG. 7 is a high level schematic block diagram of a RCA (root cause analysis) tool, according to some embodiments of the invention.

FIG. 7 is a high level schematic block diagram of a RCA tool 200, according to some embodiments of the invention. RCA tool 200 may be based on measurements and/or on simulations. RCA tool 200 may be associated with a metrology tool 70 and may comprise at least one computer processor 201, e.g., configured to carry out method 100 at least partially, and possibly associated with computer program product(s) comprising a computer readable storage medium having computer readable program embodied therewith and configured to carry out the relevant stages of method 100. RCA tool 200 may receive process related parameters 80 such as process step and corresponding characteristics, process parameters and stack data; as well as measurement data 85 such as recipe(s), measurement parameters and metrology metric(s)—and provide landscape(s) 90, pupil image(s) 91 and/or resonance region(s) 95 and possible wafer mapping 170 thereof as disclosed herein—these may be used to provide information concerning various characteristics and possibilities for process and/or measurement corrections 210 such as data concerning process variation, types of process variation, root causes for variation etc.

Asymmetric Process Variation

RCA tool 200 may be further utilized to simulate different types of asymmetric process variation in combination with the thickness variations corresponding to what was measured over the wafer with metrology tool 70. Non-limiting examples for asymmetric process variation comprise grating asymmetry, topography, cell-to-cell variation, target noise, or any process variation that breaks the asymmetry inside the same target. If the accuracy of the chosen recipe is altered over the wafer, RCA tool 200 may be used to quantify the expected inaccuracy for different types of process variations. Moreover, RCA tool 200 may be configured to suggest different target designs, different SCOL algorithms and/or or different recipes for use in the sites with estimated process variation which may lead to unacceptable inaccuracy (according to measurement data and/or simulation with measurement data 85). Generic behavior of asymmetric process variation in terms of the landscape and pupil analysis may be tracked and used to identify specific process variation and root causes from processes leading to overlay metrology excursions (basically as described above concerning symmetric process variation, with the following adjustments).

In certain embodiments, method 100 (see FIG. 6) comprises detecting a sign change (stage 160) in the at least one resonance region, and estimating asymmetric process variation therefrom (stage 165). In certain embodiments the sign change comprises a reversal of an inaccuracy gradient upon changing the at least one parameter.

Figure 4:
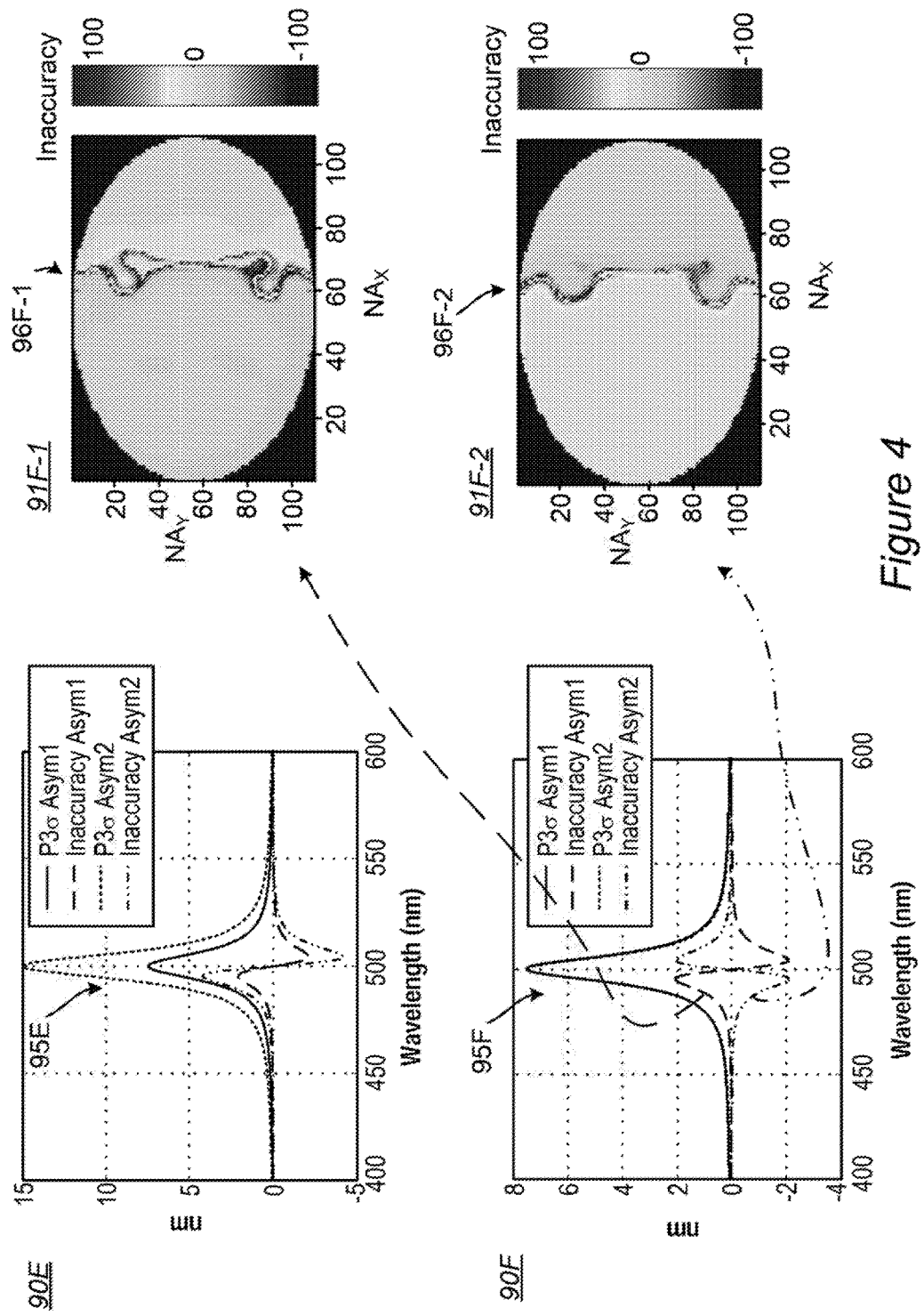
FIG. 4 is a schematic example illustrating the effects of asymmetric process variation, according to some embodiments of the invention.

FIG. 4 is a schematic example illustrating the effects of asymmetric process variation, according to some embodiments of the invention. FIG. 4 schematically illustrates landscapes with resonances at 500 nm. Resonance region 95E in landscape diagram 90E illustrates a doubling of asymmetric process variation strength that results in increased amplitudes of P3σ and the inaccuracy (Asym1→Asym2, broken lines). Resonance region 95F in landscape diagram 90F illustrates sign switching of the inaccuracy due to an asymmetry in the measured target (e.g., right SWA asymmetry versus left SWA asymmetry, SWA denoting side wall asymmetry). Pupil diagrams 91F-1 and 91F-2 schematically illustrate this sign switching by an opposite gradients in resonance regions 96F-1 and 96F-2 (note the opposite grading of inaccuracy values). Process variation strength is equal in Asym1 and Asym2, resulting in equal P3σ.

These two examples illustrate the way the landscape may change between two sites with similar asymmetric process variation, e.g., for change of strength (90E) and with the same strength (90F) of process variation. In both cases the resonance position does not change, and arc 96 appears on the pupil at the same position. However, the strengths of the pupil 3S and the inaccuracy change according to the strength of the process variation. In case the asymmetry switches signs (for example, right SWA asymmetry in one site versus left SWA asymmetry in the other site), the sign switching of the accuracy may be identified in the landscape, e.g., of the overlay measured at different wavelengths, or from the pupil. A sign switching of arc discontinuity 96 may be used to indicate a sign switching of the asymmetric noise due to process variations.

Therefore, the resonant regions, as well as the strengths of the Pupil3S, cleaned from the Y asymmetry, may be used for monitoring asymmetry process variation and their repartition over the wafer. The relative strengths of the asymmetry between sites on wafer may be calculated by different methods (e.g., PCA—principle component analysis, different methods for monitoring scaling, etc.). RCA tool 200 may also be used for quantifying the process variation. The signature of the asymmetric process variation over the wafer may also be used as an indication of the root cause of the inaccuracy (e.g., etch issues as root causes).

Figure 5:
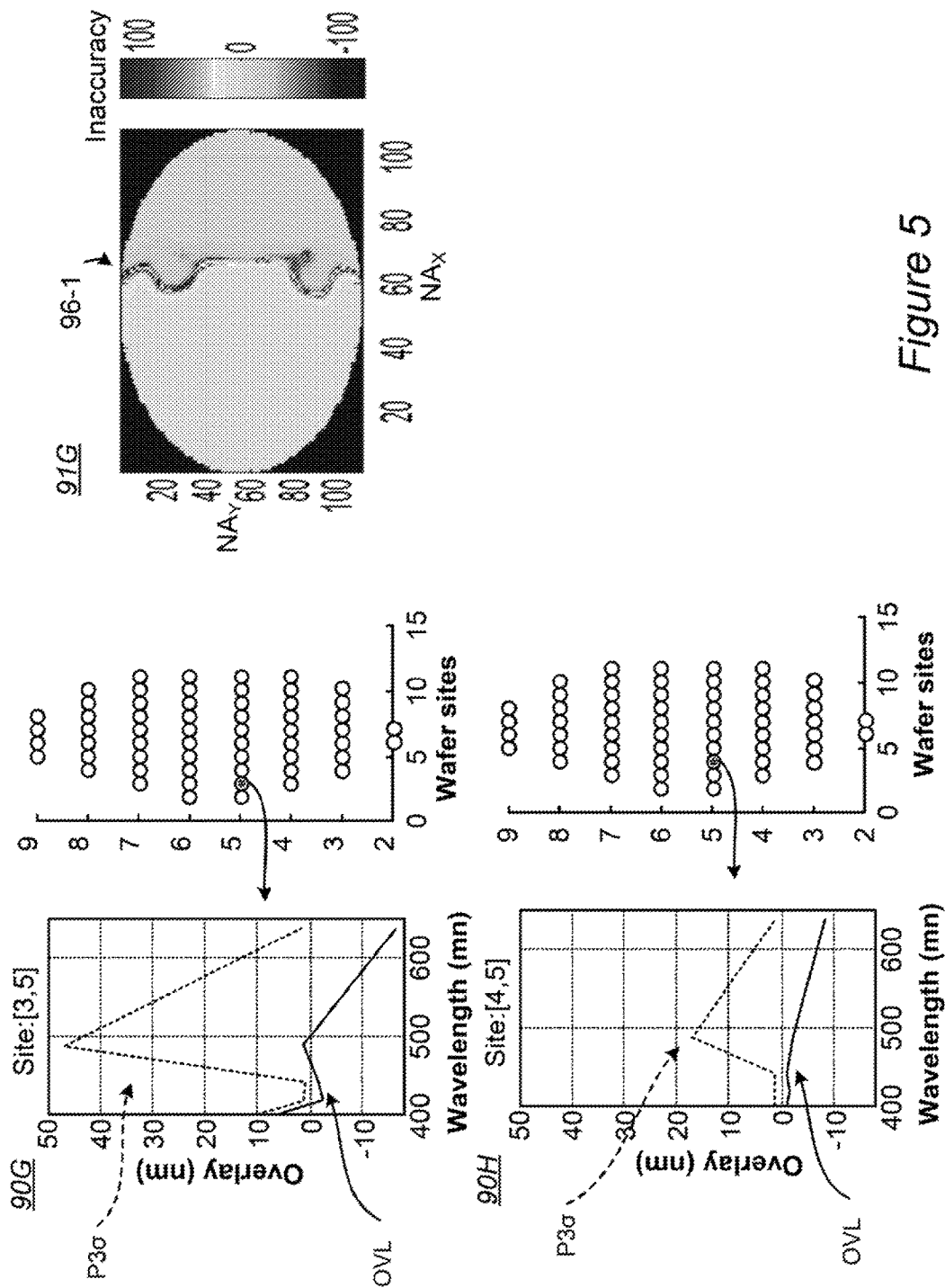
FIG. 5 is a schematic example for mapping of asymmetric process variation according to the location of the arc in the pupil, over the wafer, and specifically in different sites of the wafer, according to some embodiments of the invention.

FIG. 5 is a schematic example for mapping 170 of asymmetric process variation according to the location of arc 96 in the pupil, over the wafer, and specifically in different sites of the wafer, according to some embodiments of the invention. In the illustrated example, tens of SCOL targets were measured over a wafer with all available wavelengths in order to create a discrete landscape, and for specific sites, measurements of the overlay (OVL) and the variation (P3σ) are presented for different wavelengths. The sequence of images 90G, 90H, 90I, 90J presents the corresponding landscapes (Pupil3σ and overlay) at locations on the wafer extending from its periphery, or edge, to the wafer center. It is noted that both P3σ and OVL scale with respect to each other (as seen in FIG. 4 as well) and are maximal at the edge of the wafer and minimal (and flat) at the center of the wafer. Pupil images 91G, 91J are presented for the peripheral and central sites, respectively, and shown the sign switching that occurs upon crossing the center of the wafer (note that the central site for 90J, 91J is off-center to the right while peripheral site for 90G, 91G is to the left of the wafer center). The inventors have found out that such pattern is typical for asymmetric process variation which results at the etch step.

In certain embodiments, RCA tool 200 may be configured to combine Maxwell simulations with process RCA tools to evaluate the expected topography and asymmetric process variations that are going to be simulated with RCWA (rigorous coupled-wave analysis). In particular, RCA tool 200 may be configured to use the position of arc 96 to improve the simulation of both the symmetric process variation and the asymmetric process variation and estimate the strength of the process variation and the inaccuracy. RCA tool 200 may be configured to employ PCA to isolate the different sites with same or very close arc positions, arc sign and/or landscape in general, with respect to corresponding metrology metrics. Various analysis methods such as regression analysis, fitting methods etc. may be used to track the peaks of resonance, the overlay behavior etc. and thus characterize the process variation and n inaccuracies. Moreover, RCA tool 200 may be configured to analyze the extent to which given measurement recipes are affected by the different types of process variation and whether the evaluated/measured process variation may affect the chosen recipe. In case the effect is large (e.g., above a specified threshold), RCA tool 200 may be configured to suggest alternative target design(s), measurement recipe(s) and or measurement algorithm(s) to improve the achieved results, e.g., extract more accurate overlay measurements.

Root Cause Analysis in Target and Process Design

In certain embodiments, method 100 may comprise determining target processability by conducting measurements at different process steps, for example after etch of the previous layer, after ARC (anti-reflective coating) step and after lithography step. a corresponding process control module may be configured to be used through process metrology in order to define whether a certain target is processed well or not, to provide a through-process metrology and verifying the possibility to print special targets like single grating targets. For example, in the non-limiting case of single grating targets, the differential signal in the pupil may be analyzed by accessing all the pixels separately to derive processability.

Certain embodiments comprise measurement recipes which are sensitive to process variation (e.g., exhibit arc(s) 96 and good enough TMU—total measurement uncertainty) and possibly RCA targets with sufficient sensitivity to process variations. Certain embodiments employ process-split wafers for RCA calibration and provision of quantitative analysis of process variation in term of OPD (optical path differences) and identification of the root causes. For example, instead of or in addition to using simulation, a wafer with known parameters may be used as a reference for calibration and provision of OPD variation estimates. As an example, a process-split wafer may comprise any of an etch process split, a deposition polish split, a focus dose variation, polish process variation and/or may be split with respect to the path of wafer through different process tools. Such splits could be between wafers in a lot or within a single wafer. Certain embodiments comprise a feedforward of a target design model, before or after such a model has been verified by simulation to measurement matching, may be used to calibrate RCA results, i.e., make the estimates of symmetric or asymmetric process variations quantitatively and more accurate. The results of the RCA may be used as a process monitor or control feedback to etch/CMP (chemical mechanical processing), especially with analyzing asymmetric process variation but also with analyzing symmetric process variation.

In certain embodiments, RCA measurements may be carried out by measuring either ARO (automatic recipe optimization) target with different recipes and/or by measuring additional targets with a same or a different recipe as defined by the ARO. RCA targets may be measured with optimized sampling, possibly different from that of the overlay metrology sampling, and be measured with an RCA optimized recipe.

Certain embodiments comprise measurement of additional target/recipe with same/different sampling for RCA algorithms and/or possibly redefining the RCA recipe when overlay excursion occurs as defined by the defense system with various accuracy flags. An RCA recipe may be used in addition to the ARO (automatic recipe optimization) recipe to track process variation leading to metrology excursions, in order to provide predictions (e.g., using RCA flags described herein) concerning possible metrology excursions (before they occur), and optionally redefining a new ARO recipe to avoid the metrology excursions.

Certain embodiments comprise asymmetric metrology metrics based, e.g., on the difference between overlays such as OVL (ARO and robust) minus OVL(RCA), as the difference between the OVL measurements between the two recipes is proportional and related to the asymmetric process variation map over a wafer. The same method could be applied to various metrics. Such metrics may be mapped to create wafer maps of asymmetries, asymmetry variability, 3S, etc., and possibly to redefine the sampling and/or provide feedback as correctables to process control modeling modules to correct ADI (After Develop Inspection) models. Such metrics may also be used to correlate ADI to AEI (after-etch inspection) bias to quantify the contribution from sacrificial layers. Certain embodiments comprise defining methods to use RCA recipe/wafer and using the RCA methodology for defining better sampling for extracting residuals and correctables. The RCA recipe(s) may be used to track process variation even when the ARO recipe seems robust, in order to define new sampling(s) of the ARO recipe in which all the sites correspond to process robust RCA recipe, e.g., so that the measurements are carried out at the same landscape region over all sites.

In certain embodiments, method 100 comprises using 'smart' PCA (principal component analysis) on pupil for RCA, e.g., for analyzing pupil images like $D_1-D_2$ (see Equation 1) for and of: Mapping different process variation types, discriminating between different kinds of process variation (symmetric and asymmetric) and/or identifying a specific resonant pupil, RCA recipe between different wafers/slot (e.g., for avoiding confusion between different resonant regime).

In certain embodiments, method 100 comprises applying new algorithm(s) for identifying different types of process variation and as a flag for identifying single scattering region. For example, new differential signals $D_{alpha}$ and $D_{beta}$ may be defined as in Equations 2, with $S_{\pm1}$ and $S_{\pm2}$ representing the diffraction signals of diffraction orders ±1 and ±2, respectively, and quantities G and Δ may be defined with respect to them as further defined in Equations 2, with $f_0$ representing the predefined offset and α, β defined with respect to $\widetilde{D_1}$ and $\widetilde{\widetilde{D_1}}$:

$$\widetilde{D_1} = S_{+1} - S_{-2}; \widetilde{\widetilde{D_1}} = S_{+2} - S_{-1}$$

$$\alpha + \beta = G = (D_1 - D_2)/2f_0;$$

$$\Delta = (D_{alpha} - D_{beta})/2f_0 = (\alpha - \beta) \qquad \text{Equations 2}$$

The quantity Δ indicates how much α differs from β and its variability may be related to the asymmetric process variation and may be separately calculated for X and Y targets to recreate a wafer map of asymmetric process variation. The quantity Δ may also be used as a flag that identifies whether the multiple scattering in the grating over grating structure (of the metrology target) starts being non negligible or inversely, and whether the single scattering model may be used.

In certain embodiments, the quantities $O_1$ and $O_2$, defined as $$O_{1,2} = f_0 \frac{D_{\alpha,\beta}}{D_1 - D_2}$$

may also be defined and used. Ideally and in the single scattering model, $O_1$ and $O_2$ have the same contribution to the final overlay value given by the sum of the differential signals over their difference. The signal of each of the cells may be modeled as expressed in Equations 3, with C denoting a constant and ∈ denoting the accurate overlay:

$$S_+^1 = C + \alpha(\in + f_0)$$

$$S_-^1 = C - \beta(\in + f_0)$$

$$S_+^2 = C + \alpha(\in - f_0)$$

$$S_-^2 = C - \beta(\in - f_0) \qquad \text{Equations 3}$$

The quantity C may be extracted algebraically and be used as a flag for asymmetric process variation. The quantities α and β may be calculated separately.

Certain embodiments comprise using a model for calculating the OPD which is based on single scattering. The expressions $\widetilde{D_1}$, $\widetilde{\widetilde{D_1}}$ are used to derive the expression $\tilde{G} = \widetilde{D_1} - \widetilde{\widetilde{D_1}}$ as defined in Equations 4, used for a single scattering model of the grating-over-grating structure of the SCOL cells, as explained below. Ψ denotes the OPD phase, δΨ denotes a phase asymmetry, ∈ denotes the real OVL, $r_l$ denotes the reflectivity from the lower grating and $r_u$ denotes the reflectivity for the upper grating. Using a single scattering model of diffraction for a grating over grating structure, we find that:

$$G = D_1 - D_2 = -8 r_l r_u \sin\left(\frac{2\pi f_0}{P}\right) \sin(\Psi) \cos(\delta\Psi + \epsilon)$$

$$K = D_1 + D_2 = -8 r_l r_u \cos\left(\frac{2\pi f_0}{P}\right) \sin(\Psi) \sin(\delta\Psi + \epsilon)$$

$$\tilde{G} = \widetilde{D_1} - \widetilde{\widetilde{D_2}} = -8 r_l r_u \sin\left(\frac{2\pi f_0}{P}\right) \cos(\Psi) \cos(\delta\Psi + \epsilon) \qquad \text{Equation 4}$$

Using Equations 4, the OPD phase could be calculated as $$\Psi = \operatorname{atan}\left(\frac{K}{Y} \tan \frac{2\pi f_0}{P}\right).$$

The assumptions of single scattering model may be validated using α and β defined above in order to verify the possibility of calculating the OPD phase using the model. Moreover, the inventors have found out in simulations that the calculation of Ψ using the discussed assumptions is mainly sensitive to asymmetric process variation in resonance regions, while in flat region it gives better estimation of the pure OPD, and therefore can be used in process variation estimation and root cause analysis. Moreover, the algorithm may be used to perform RCA with a single recipe. The wafer signature of the calculated OPD gives the signature of either the symmetric or asymmetric process variation depending on what recipe is used.

In certain embodiments, asymmetric process variation may be estimated by selecting specific region of the pupil with the quantity G being similar across the entire wafer. Even in case of symmetric process variation, Pupil 3S cleaned from perpendicular asymmetry (MEB) may be calculated on this specific region to estimate the asymmetric process variation.

Correspondingly, method 100 may comprise carrying out root cause identification 174 in parallel to metrology measurements to predict metrology excursions (stage 190) and possibly adjusting a metrology measurements recipe according to the predicted metrology excursions (stage 192). Method 100 may further comprise analyzing the derived landscape with respect to different sites on a wafer 170, optionally using a reference wafer to derive the estimation of process variation in the sites with respect thereto (stage 194) and adjusting a sampling for a metrology measurements recipe to carry out the metrology measurements on sites across the wafer, which correspond to a same region of the landscape (stage 196). Certain embodiments comprise RCA tools 200 (see FIG. 7 above) which are configured to carry out stages of method 200.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
deriving a landscape from simulation and/or from a plurality of scatterometry measurements of a semiconductor wafer using a metrology tool having a processor executing instructions on a computer readable storage medium, wherein the landscape comprises an at least partially continuous dependency of at least one metrology metric on at least one parameter,
identifying, in the derived landscape, at least one resonance region that corresponds to a resonance of optical illumination in a measured location using the processor,
analyzing a dependency of the identified at least one resonance region on specified changes in the at least one parameter using the processor, and
deriving from the analysis an estimation of process variation using the processor.

2. The method of claim 1, wherein the at least one parameter comprises any of: an illumination wavelength, a pupil location, a measurement parameter, and a process parameter.

3. The method of claim 1, wherein the at least one metrology metric comprises at least one of an overlay, an overlay variation metric and an inaccuracy metric defined with respect to the overlay.

4. The method of claim 3, wherein the overlay is calculated as $\mathrm{OVL}(\vec{p}) = ((D_1(\vec{p}) + D_2(\vec{p}))/(D_1(\vec{p}) - D_2(\vec{p}))) \cdot f_0$, with $\vec{p}$ representing a pupil pixel, $f_0$ denoting a designed offset, and with $D_1$ and $D_2$ denoting, corresponding to opposite designed offsets, differences between signal intensities of opposing orders measured at pupil pixels which are rotated by 180° with respect to each other.

5. The method of claim 1, further comprising detecting a movement of the at least one resonance region across a simulated and/or measured pupil image as the at least one parameter, and estimating symmetric process variation therefrom.

6. The method of claim 1, further comprising detecting a sign change in the at least one resonance region, and estimating asymmetric process variation therefrom.

7. The method of claim 6, wherein the sign change comprises a reversal of an inaccuracy gradient upon changing the at least one parameter.

8. The method of claim 5, further comprising:
mapping the identified at least one resonance region over a plurality of measurement locations on a wafer,
characterizing at least one spatial relation in the mapping, and
identifying a root cause for the process variation according to the characterization.

9. The method of claim 8, further comprising carrying out the root cause identification in parallel to metrology measurements to predict metrology excursions.

10. The method of claim 9, further comprising adjusting a metrology measurements recipe according to the predicted metrology excursions.

11. The method of claim 1, further comprising analyzing the derived landscape with respect to different sites on a wafer.

12. The method of claim 11, further comprising using a reference wafer to derive the estimation of process variation in the sites with respect thereto.

13. The method of claim 11, further comprising adjusting a sampling for a metrology measurements recipe to carry out the metrology measurements on sites across the wafer, which correspond to a same region of the landscape.

14. A computer program product comprising a non-transitory computer readable storage medium having computer readable program embodied therewith, the computer readable program configured to carry out the method of claim 1.

15. A metrology tool configured to carry out the method of claim 1.

16. An RCA (root cause analysis) tool associated with a metrology tool that includes at least one computer processor, the RCA tool being configured to receive process related parameters and measurement data of a semiconductor wafer, and derive therefrom a landscape and at least one resonance region in the landscape, wherein the landscape comprises a dependency of at least one metrology metric on at least one parameter and the at least one resonance region corresponds to a resonance of optical illumination in a measured location, the RCA tool being further configured to evaluate a process variation from an analysis of changes in the at least one resonance region in the landscape with respect to the received process related parameters and measurement data.

17. The RCA tool of claim 16, further configured to map changes in the at least one resonance region over at least one wafer.

18. The RCA tool of claim 17, wherein the mapping is carried out with respect to at least one of: a wafer, a process-split wafer, and a plurality of wafers of a lot.

19. The RCA tool of claim 16, further configured to provide correctables based on the evaluated process variation.

20. The RCA tool of claim 16, further configured to derive a root cause analysis of evaluated process variation.

21. The RCA tool of claim 20, further configured to simulate a modeled stack with various homogenous thickness variations to derive patterns of process variation, and to relate the derived patterns to specific process-related root causes.

22. The RCA tool of claim 21, further configured to incorporate in the simulation asymmetric process variation factors comprising at least one of: grating asymmetry, topography, cell-to-cell variation, target noise, and any process variation that breaks the asymmetry inside the modeled stack.

23. The RCA tool of claim 22, further configured to quantify an expected inaccuracy for different types of process variations and suggest modifications to at least one of: target designs, metrology algorithms and measurement recipes.

* * * * *